Jan. 16, 1962 J. M. WOLFSKILL 3,017,525
MOUNTING SUPPORT FOR PIEZOELECTRIC CRYSTAL UNITS
Filed Nov. 26, 1956
FIG. 1
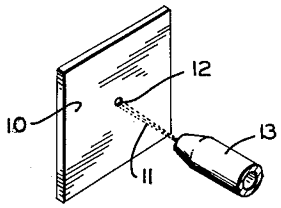
FIG. 2
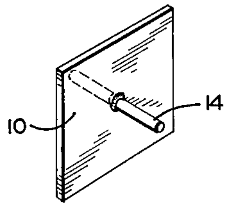
FIG. 3
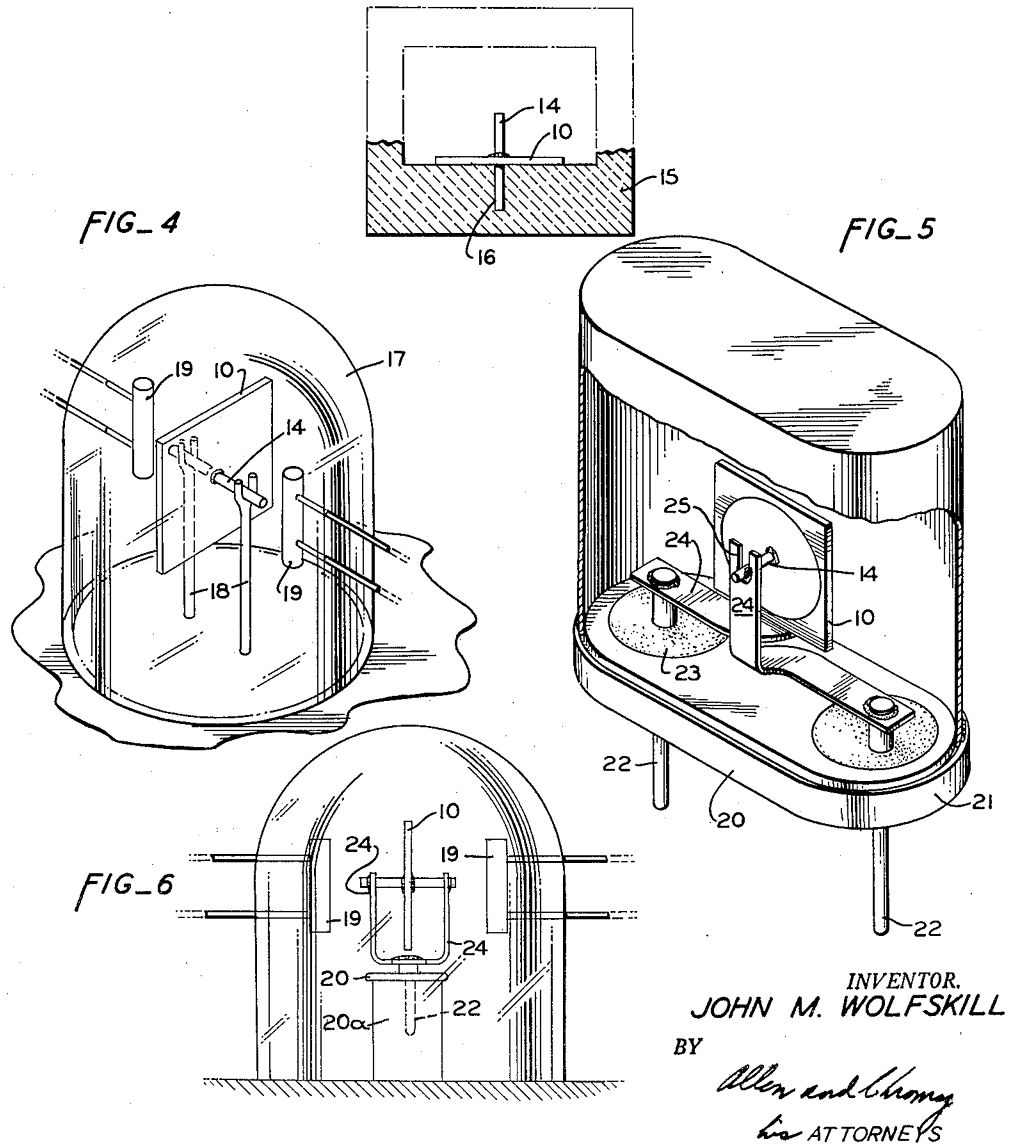
FIG. 4, FIG. 5, FIG. 6
INVENTOR.
JOHN M. WOLFSKILL
BY
Allen and Chromy
his ATTORNEYS 3,017,525
Patented Jan. 16, 1962

3,017,525

MOUNTING SUPPORT FOR PIEZOELECTRIC CRYSTAL UNITS

John M. Wolfskill, Union Station Bldg., Erie, Pa.

Filed Nov. 26, 1956, Ser. No. 624,327
1 Claim. (Cl. 310—9.4)

This invention relates to piezoelectric crystals in general. More particularly this invention relates to an improved mounting arrangement for supporting low frequency piezoelectric quartz crystals such that their activity and frequency characteristics with temperature are practically independent of the mounting means.

It is an object of this invention to provide an improved mounting means for low frequency piezoelectric crystals having contiguous electrodes of varying areas and shapes so that the crystals are free from activity variations over a wide temperature range and also have greatly improved frequency vs. temperature characteristics.

It is another object of this invention to provide a mounting means which results in improved activity of the piezoelectric crystals.

It is still another object of this invention to provide a mounting means for piezoelectric crystals in which no solder is directly applied to surfaces or electrodes of the piezoelectric crystal for support thereof.

It is another object of this invention to provide a mounting means for piezoelectric crystals in which many of the operations of assembly are greatly simplified.

Another object of the invention is to provide a simplified mounting means for piezoelectric crystals with the result that the effects of aging on the piezoelectric crystals with time or due to heat cycling is greatly minimized.

In the prior art practically all low frequency piezoelectric quartz crystals, including the well known X-Cut, CT, DT, GT, +42° bars as well as the MT, NT and similar cuts, in which contiguous electrodes are used, have practically all been mounted by means of soldering either a straight wire or a headed wire directly to the contiguous electrodes on the major faces, and usually perpendicular to them. These wires are attached to the electrodes at the crystal nodal points after application of a fired silver spot or evaporated silver electrodes to these major faces as pointed out above.

Many types of solder and their alloys have been used in these soldering operations and all of them have been found to affect adversely the frequency stability and activity of the crystal units.

It is well known in the art that solder loses a high percentage of its strength, particularly in tension a short time after the soldering operation is completed. It is also well known that temperature cycling or maintaining the crystal unit having such soldered connections, at elevated temperatures for relatively short periods of time, causes the crystals to age in frequency and activity very substantial amounts. Subjecting the crystals to such temperature conditions may effect many other of their characteristics, including the shape of the temperature characteristic curve, the peaking point with temperature of such curves, the activity of the crystals, their ability to withstand shock and vibration, etc.

Practically all of these elements are variable and will vary with time, even at room temperature, and at a greatly accelerated rate at elevated temperature because of the change in the crystalline structure of the solder or alloys used to mechanically fasten the support wires to the crystal electrode faces.

Prior to this invention all of these factors have been difficult to control and considerable allowance had to be made for these effects in actual use of the crystal units so made. This invention alleviates all these problems by mounting the crystals in such a manner that no solder or solder alloys are used directly on the contiguous crystal electrodes to attach any means of support.

Support of the crystal in this invention is accomplished by drilling a small hole through the crystal from one face to the other, at or near the nodal point. This hole must be drilled in such a manner as to avoid or eliminate the possibility of leading or incipient cracks around the periphery of said hole. Such a drilled hole can be produced by the use of an abrasive tool in which abrasive particles are forced against the quartz crystal in a well defined pattern to produce a very small round, square or rectangular hole. The S. S. White Mfg. Company makes an equipment that is suitable for drilling such holes.

The hole is best made prior to the application of the contiguous electrodes to the crystal face although it can even be drilled or cut through the crystal after such electrodes are applied thereto. A small rod of either round, square, or rectangular cross section of insulating material and high strength is then passed through the hole with a sufficient length extending on either side of the crystal faces for supporting the crystal in the crystal holder. Such small diameter mounting rods of high strength may be made out of a variety of material, such as, ceramics, sapphire, fused quartz, crystalline quartz, "Teflon," spun glass fiber cord impregnated with cement or one of the epoxy type resins to provide rigidity, "Bakelite" or plastic materials having sufficient strength.

It has been found that sapphire rod is an excellent material to use in this application because of its hardness and strength and temperature characteristics. Also it has characteristics which are compatible with various glass frits which can be used for cementing it to the crystal. A number of cements can be used for the application. It has been found however that glass or glass frit applied around the rod in the hole through the quartz crystal can then be fired to about 560° C. so as to melt the glass or glass frit and produce a good bond between the sapphire and crystalline quartz. This method of joining the rod to the crystal is practically free of any deleterious effects due to temperature changes up as high as 400° C.

After the rod is positioned in the hole through the crystal, by means of the above described method, so the support rod is perpendicular to the crystal blank, the entire assembly is placed in a metal evaporating chamber and electrodes are evaporated onto the crystal. During this process the rods will also be coated with the metal plating, such as silver, gold or other evaporated metals, which then completes the connection of the electrodes to the rods. These rods are then attached to the main support wires of the crystal holders in any convenient way as by soldering, conductive cements or mechanical clips and the like.

Units so produced have shown greatly improved frequency-temperature characteristics especially in the higher temperature regions between 85° C. and 200° C. In the prior art, crystals of this low frequency face shear type have never been known to operate satisfactorily much above 110° C. In the normal temperature range in which such crystals are used (−40° to plus 85° C.), it is well known that they have frequency-temperature characteristic curves, which are of parabolic shape; this is particularly true of the DT and CT type crystals. The shape of the curve is such that the frequency first rises with temperature, passes through an inflection point and then drops with temperature.

It has been discovered that this parabolic shape of CT and DT cut crystal blanks is completely different when mounted in accordance with this invention in that the curve does not drop off in frequency nearly as rapidly at the high temperature end. Such a drop off is caused by the mounting heretofore used in which solder connections were employed for supporting the crystal blank and this resulted in poor frequency-temperature characteristics particularly at higher operating temperatures. The frequency-temperature characteristics of crystals mounted in accordance with this invention are not materially affected by the supporting means of the crystal blank. Consequently, with this invention it is possible to materially improve the frequency-temperature stability characteristics of crystals over very wide temperature ranges.

Furthermore, the shock and vibration characteristics of a crystal unit mounted in accordance with this invention is also greatly improved and normal deterioration which took place in the conventional mounting employing soldered connections has been substantially eliminated.

Referring to the drawing briefly:

FIGURE 1 is a schematic view showing a small hole being cut through a quartz crystal;

FIGURE 2 shows the quartz crystal illustrated in FIG. 1 with a small rod positioned in the hole cut therethrough;

FIGURE 3 is a view showing the quartz crystal and rod assembly being heated to melt the glass frit used for cementing the rod into the hole in the quartz crystal;

FIGURE 4 is a view showing the quartz crystal and rod assembly supported in a metal evaporating chamber in which metal electrodes are applied to the crystal and rod by evaporation;

FIGURE 5 is a view showing the crystal supported in a mounting whereby it may be connected into an electrical circuit; and FIGURE 6 is a view showing a crystal supported in a chamber for the appliction of electrodes to the crystal which is supported in the chamber by the finished mounting.

The quartz crystal 10 shown in FIGURE 1 consists of a wafer cut from the natural or synthetic mother crystal in accordance with processes well known in the art. This crystal blank or wafer is cut to certain dimensions, depending upon the frequency at which it is desired to operate the finished crystal. This blank 10 is supported in any convenient manner and a well-defined stream of abrasive 11 or other cutting medium is directed against the small area 12 through which a hole is to be cut. This hole may be cut through the crystal blank in any desired manner such as by using the above mentioned stream of abrasive or by use of a supersonic type of drill or by any other means as long as a clean and well-defined hole of small dimensions, approximately 0.015 inch in diameter, is produced through the crystal blank. Of course, the diameter of this hole will depend upon the size of the crystal blank that is to be supported and also upon the material used for supporting it; however, the above dimension is satisfactory for a crystal blank that is provided with major faces that are approximately one half inch square, and the thickness of which is approximately 0.015 inch.

In drilling or cutting the hole through the crystal blank consideration of prime importance resides in the fact that no incipient cracks or fractures may be produced around the edges of the hole formed in the crystal blank during the cutting of said hole. Furthermore, no strains or stresses which would result in cracks or flaws being produced in the crystal blank, should result from this operation.

After the desired hole is cut into the crystal blank 10, a small sapphire rod 14 that is approximately 0.010 inch in diameter is inserted into this hole and a small amount of glass frit is placed into the hole surrounding the sapphire rod 14. The crystal blank and rod are then supported upon a heated surface such as the surface 15 shown in FIGURE 3. This surface may be provided with a hole 16 which is just big enough to receive the portion of the rod 14 projecting from one side of the crystal blank 10. The hole 16 must also be formed in the surface 15 with sufficient precision so that when the crystal blank 10 rests thereon the rod 14 will be disposed exactly at right angles to the major faces of the crystal blank. When the crystal blank and rod assembly are thus supported in a suitable jig, the assembly is heated sufficiently, that is, to about 550° C., to melt the glass frit and cement the rod 14 in the hole provided to the crystal blank 10.

Rods of various materials other than sapphire may be employed in accordance with this invention, for example, the rod 14 may be made of ceramic materials, fused quartz, crystalline quartz, spun glass fiber cord impregnated with cement or with an epoxy type resin, "Bakelite," "Teflon" (tetrafluoroethylene) or any other similar plastics may be used. It is, of course, obvious that if materials such as "Teflon" and "Bakelite" are employed, then suitable cements other than glass frit must be used for cementing rods thereof into the hole formed in the crystal blank and one of the epoxy type resins may be employed for this purpose, care being taken to heat this arrangement in the curing of the resin within the proper temperature range to which the rod material and resin may be subjected. This temperature will, of course, be above the normal operating temperature range of the crystal blank. Glass or glass frit may be employed with the rods made of ceramic materials, fused quartz and crystalline quartz since these will stand 560° C. temperature at which the glass or glass frit is fused or fired.

After the crystal blank 10 and the rod 14 are assembled and cemented together, the crystal and rod assembly may be mounted upon the supports 24 and cemented thereto as shown in FIGURES 5 and 6, which supports are attached to the pins 22 that are provided to the base of the crystal blank housing. The crystal blank and rod so assembled may then be positioned in the chamber 17 as shown in FIGURE 6, for the application of electrodes to the crystal blank and also for the application of conductive coatings to the exposed parts of the rod 14 whereby the crystal blank electrodes are connected to the supports 24. A metal evaporation apparatus for applying electrodes to crystals is illustrated in U.S. Patent No. 2,595,037 issued on April 29, 1952.

On the other hand the electrodes may be applied to the crystal blank prior to the assembly of the crystal blank and rod on the supports 24 of the final holder as shown in FIGURES 5 and 6. In other words, the crystal blank 10 and rod 14 assembly may be positioned in the evaporating chamber 17 as shown in FIGURE 4 wherein electrodes are applied to the major faces of the crystal blank or to selected portions thereof and metallic coatings are also applied to the exposed portions of the rod 14 by evaporation of metal from the members 19. The process known as cathode sputtering may also be employed for applying the electrodes to the crystal blank 10 if desired. In that case a pair of electrodes which may be in the form of rings, one positioned on each side of the crystal blank shown in FIGURE 4, is employed to direct the sputtered gold or silver vapor onto exposed surfaces of the crystal blank 10. These exposed surfaces would, of course, comprise the central areas of the major faces of the crystal blank and also the exposed surfaces of the rod 14. In this case these ring-shaped electrodes are connected to the positive terminal of the source of high voltage current supply employed in the sputtering process and the negative terminal is connected to the electrodes 19 from which the gold or silver metal is sputtered. These metal evaporation and cathode sputtering processes are known in the art and may be employed in both of the arrangements shown in FIGURES 4 and 6. Suitable masks also may be provided to the crystal blank 10 to prevent metal from being evaporated upon surfaces of the crystal blank where it is not desired.

Sufficient metal must be placed upon the electrode area of the crystal blank and upon exposed portions of the rod 14 so that electrically conductive surfaces are provided thereto, such as will enable the crystal to function properly in the electric circuit in which it is to be employed.

Either before or after the metal coatings for the electrodes are provided to the crystal blank 10 and the rod 14 as described above, the unit is assembled into a holder such as shown in FIGURE 5 which comprises a base 20 that is provided with a groove 21 and a pair of plug-in pins 22. The pins 22 are supported in the base 20 by suitable insulation sleeves 23 through which these pins extend so that the L-shaped members 24 may be attached to the tops of these pins 22 by soldering, spot welding, silver soldering, brazing and the like. The spot welding, brazing or silver soldering methods are desirable where the crystal is to be operated at relatively high temperatures such as 400° C., for example. The free ends of the L-shaped members 24 extend upward alongside of the crystal blank and they are provided with notches 25 into which the free end portions of the metal coated rod 14 are cemented by using, for example, a low temperature fired silver bonding cement such as is employed for a similar purpose in U.S. Patent No. 2,481,806, issued on Sept. 13, 1949.

Other ways of attaching the rod 14 to the supports 24 may be employed and these may include spring clips. In addition the members 24 may be made of wire and the clips made integral therewith if desired.

Where crystals of the longitudinal type cuts having more than one nodal point are mounted in accordance with this invention, it is of course desired to support the crystal at more than one point. In such cases two or more rods may be provided for supporting the crystal at two or more nodal points.

While I have shown a preferred embodiment of the invention it will be understood that the invention is capable of variation and modification from the form shown so that its scope should be limited only by the scope of the claim appended hereto.

I claim:

Piezoelectric crystal apparatus for use at relatively high operating temperatures, the piezoelectric crystal being mounted so that the piezoelectric activity and frequency characteristics of the crystal are substantially unaffected by the mounting thereof at relatively high temperatures in the range 85° C. to 200° C. or higher comprising in combination: a piezoelectric crystal having major faces, said piezoelectric crystal having a hole formed therethrough substantially at a nodal point thereof, said hole being small compared to a dimension of a major face of said crystal and said hole being formed so that no incipient cracks are produced in the side walls thereof, a rod of insulating material positioned in said hole, said rod being adapted to withstand the relatively high operating temperature of said crystal without being deformed, means comprising fired glass frit for bonding said rod to surfaces of said hole so that said crystal may be supported thereby, said means also being able to withstand shock and vibration and the relatively high operating temperature of said crystal, contiguous electrodes applied to areas of said major faces and a coating of electrically conductive material on the exposed part of said rod on each side of said crystal extending to and contacting the electrode on the corresponding crystal side.

References Cited in the file of this patent

UNITED STATES PATENTS

| | | |
|---|---|---|
| 2,194,676 | Schneider | Mar. 26, 1940 |
| 2,224,891 | Wright | Dec. 17, 1940 |
| 2,386,279 | Tibbets | Oct. 9, 1945 |
| 2,492,357 | Chatterjea et al. | Dec. 27, 1949 |
| 2,493,145 | Jaffe | Jan. 3, 1950 |
| 2,657,320 | Ziegler | Oct. 27, 1953 |
| 2,784,481 | Kitterman | Mar. 12, 1957 |

FOREIGN PATENTS

| | | |
|---|---|---|
| 607,363 | Great Britain | Aug. 30, 1948 |